United States Patent
Rowley et al.

(10) Patent No.: US 10,402,351 B2
(45) Date of Patent: Sep. 3, 2019

(54) INTERFACE COMPONENTS

(71) Applicant: Micron Technology, Inc., Boise, ID (US)

(72) Inventors: Matthew D. Rowley, Boise, ID (US); Peter R. Castro, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,171

(22) Filed: Aug. 23, 2018

(65) Prior Publication Data

US 2019/0012280 A1    Jan. 10, 2019

Related U.S. Application Data

(63) Continuation of application No. 15/642,906, filed on Jul. 6, 2017, now Pat. No. 10,140,222.

(51) Int. Cl.
| | |
|---|---|
| *G03F 3/06* | (2006.01) |
| *G11C 7/10* | (2006.01) |
| *G06F 12/02* | (2006.01) |
| *G06F 13/16* | (2006.01) |
| *G06F 13/40* | (2006.01) |
| *G06F 13/42* | (2006.01) |
| *G06F 3/06* | (2006.01) |

(52) U.S. Cl.
CPC ........ *G06F 13/1668* (2013.01); *G06F 3/0619* (2013.01); *G06F 3/0649* (2013.01); *G06F 3/0683* (2013.01); *G06F 12/0253* (2013.01); *G06F 13/4068* (2013.01); *G06F 13/4282* (2013.01); *G11C 7/10* (2013.01); *G11C 7/1006* (2013.01); *G11C 7/1018* (2013.01); *G11C 2207/107* (2013.01)

(58) Field of Classification Search
CPC .. G06F 13/1668; G06F 3/0619; G06F 3/0649; G06F 3/0683; G06F 12/0253; G06F 13/4282; G11C 7/10; G11C 7/1006; G11C 7/1018; G11C 2207/107
See application file for complete search history.

(56) References Cited

U.S. PATENT DOCUMENTS

| 6,215,727 | B1 | 4/2001 | Parson et al. |
| 7,013,359 | B1 | 3/2006 | Li |
| 8,599,623 | B1 | 12/2013 | Clark et al. |

(Continued)

FOREIGN PATENT DOCUMENTS

WO    2010080141 A2    7/2010

OTHER PUBLICATIONS

International Search Report and Written Opinion from related international application No. PCT/US2018/039226, dated Nov. 8, 2018, 14 pp.

(Continued)

*Primary Examiner* — Glenn A. Auve
(74) *Attorney, Agent, or Firm* — Brooks, Cameron & Huebsch, PLLC (57) ABSTRACT

In an example, an apparatus may have a controller to be coupled to a host, an interface component coupled to the controller, and a plurality of memory devices coupled to the interface component. The interface component may be to cause a memory device of the plurality of memory devices to perform an operation in response to a command from the controller.

20 Claims, 4 Drawing Sheets

(56) References Cited

U.S. PATENT DOCUMENTS

| | | |
|---|---|---|
| 9,202,585 B2 | 12/2015 | Lee et al. |
| 10,140,222 B1* | 11/2018 | Rowley .............. G06F 13/1668 |
| 10,146,711 B2* | 12/2018 | Nale ................... G06F 13/1673 |
| 2007/0162670 A1 | 7/2007 | Yang et al. |
| 2011/0131369 A1 | 6/2011 | Eleftheriou et al. |
| 2011/0252162 A1 | 10/2011 | Li et al. |
| 2011/0276775 A1 | 11/2011 | Schuetz |
| 2013/0013878 A1 | 1/2013 | Frans et al. |
| 2014/0040518 A1 | 2/2014 | Udipi et al. |
| 2014/0344498 A1 | 11/2014 | Buban |
| 2015/0049552 A1 | 2/2015 | Park |
| 2015/0067276 A1 | 3/2015 | Toshiba |
| 2015/0301763 A1 | 10/2015 | Shaharabany et al. |
| 2016/0284393 A1* | 9/2016 | Ramalingam ....... G11C 11/5628 |
| 2017/0060788 A1 | 3/2017 | Chang et al. |
| 2017/0097790 A1 | 4/2017 | Doo et al. |
| 2017/0269875 A1* | 9/2017 | Kim ..................... G06F 3/0659 |
| 2018/0039583 A1 | 2/2018 | Kodera et al. |
| 2018/0114587 A1 | 4/2018 | Jeddeloh et al. |
| 2018/0188998 A1* | 7/2018 | Shaharabany ........ G06F 3/0659 |

OTHER PUBLICATIONS

Office Action from related Taiwan Application No. 107123400, dated Jun. 4, 2019, 6 pages.

* cited by examiner

INTERFACE COMPONENTS

PRIORITY INFORMATION

This application is a continuation of U.S. application Ser. No. 15/642,906, filed Jul. 6, 2017, the entire contents of which are included herein by reference.

TECHNICAL FIELD

The present disclosure relates generally to storage, such as data storage, and, more particularly, to interface components.

BACKGROUND

Storage systems (e.g., to store data) may be implemented in electronic systems, such as computers, cell phones, hand-held devices, etc. Storage systems often include a controller (e.g., a memory controller) for controlling memory devices that may be used for storage (e.g. of data).

Some storage systems, such as solid-state storage devices (e.g., solid-state drives), may include non-volatile memory devices. Non-volatile memory devices provide persistent data by retaining stored data when not powered and may include NAND flash memory, NOR flash memory, nitride-read-only memory (NROM), phase-change memory (e.g., phase-change random access memory), resistive memory (e.g., resistive random-access memory), or the like.

In some examples, a storage system may have a controller (e.g., a memory controller) that may communicate with a host, such as a computer, and may receive address signals (e.g., addresses), command signals (e.g., commands), and data signals (data) from the host and may send data to the host. The controller may communicate with a memory device over a channel, such as a communication channel (e.g., a memory channel). For example, a channel may convey addresses, commands, and data from the controller to the memory device and data from the memory device to the controller. A plurality of pins may, for example, couple a channel to the controller. In some examples, a controller may communicate with a plurality of groups of memory devices over a plurality of channels. For example, the controller may control a respective group individually over the channel coupled to the respective group.

DETAILED DESCRIPTION

In an example, an apparatus may have a controller to be coupled to a host, an interface component coupled to the controller, and a plurality of memory devices coupled to the interface component. The interface component may be to cause a memory device of the plurality of memory devices to perform an operation in response to a command from the controller.

A number of embodiments of the present disclosure provide benefits, such as increased storage capacity of a storage system compared to previous storage systems. For example, more memory devices may be coupled to a controller, such as a memory controller, of a storage system, compared to previous storage systems, with little (e.g., or no) increase in the bandwidth of the controller, the number of pins of the controller, and/or the physical size (e.g., the amount of silicon) of the controller. Additional benefits may include reduced cost, increased performance, and reduced power consumption per unit of storage compared to previous storage systems.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

Figure 1:
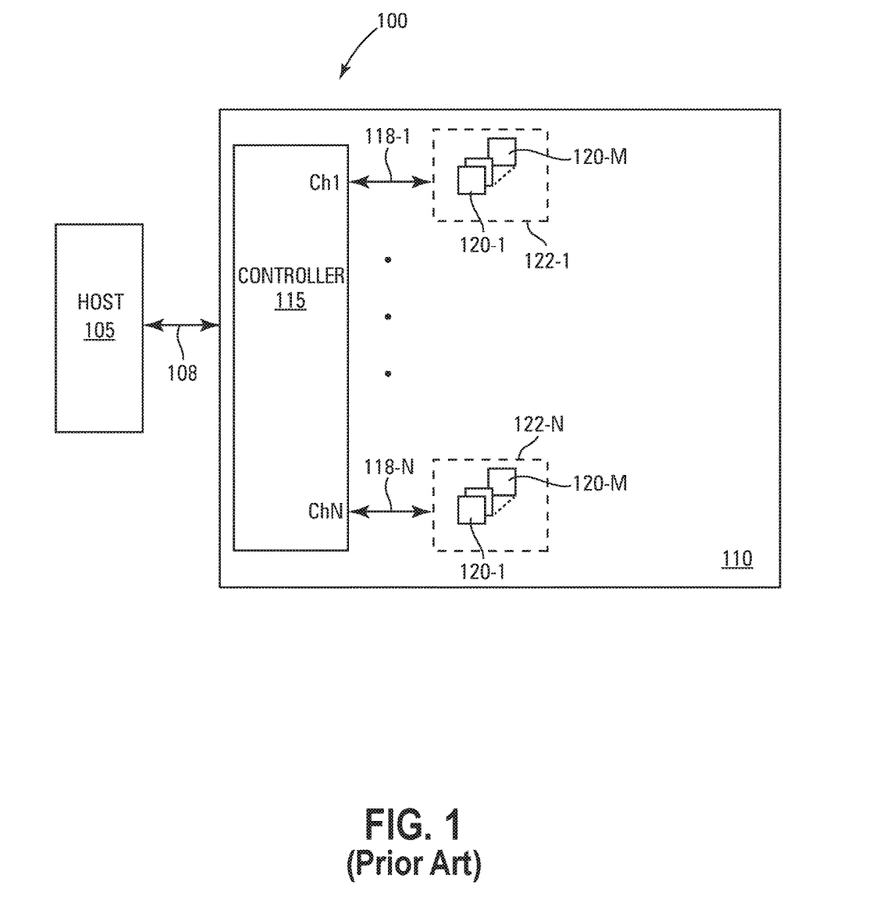
FIG. 1 is a block diagram that illustrates an example of an apparatus in accordance with the prior art.

FIG. 1 is a block diagram of an apparatus, such as a portion of a system 100 (e.g., a computing system, such as an internet-based (e.g., a "cloud,") computing system, an enterprise computing system, etc.), according to the prior art. System 100 may include a host 105 that may include one or more processors, for example. System 100 may include a storage system 110 (e.g., a memory system, such as a solid-state drive) coupled to host 105 by an interface 108, such as a host interface. The term "coupled" may include wirelessly coupled, directly coupled and/or directly connected with no intervening elements (e.g., by direct physical contact), or indirectly coupled and/or connected with intervening elements.

Storage system 110 may include a controller 115 (e.g., memory control circuitry, firmware, and/or software), such as a memory system controller. Storage system 110 may be an enterprise storage system, for example, and controller 115 may be an enterprise controller, for example. An enterprise storage system, for example, may be currently be characterized by terabytes of storage and fast performance capabilities, for example 100 MB/sec, 100 K inputs/outputs per second, etc. In some examples, storage system 110 may be a cloud storage system, and controller 115 may be a cloud controller.

Controller 115 may communicate over a plurality of channels 118, such as channels 118-1 (Ch1) to 118-N (ChN), where N might be 8, 16, 32, 64, etc. in some examples. A channel (e.g., each of channels 118-1 to 118-N) may be coupled between one or more memory devices 120, such as NAND memory devices, and controller 115. For example, each channel 118 may be coupled between memory devices 120-1 to 120-M and controller 115. In some examples, the memory devices 120-1 to 120-M may be included in a memory package 122. For example, controller 115 may respectively communicate with respective ones of memory packages 122-1 to 122-N over respective ones of channels 118-1 to 118-N. A channel as used herein may include a physical transmission medium, such as one or more wires, or a wireless transmission medium.

As storage requirements continue to increase, for example, the capacity of storage systems, such as storage system 110, continue to grow, but sometimes at the expense of the channel bandwidth. For example, the storage capacity may be increased by increasing the number of memory devices coupled to each channel 118.

Another way to increase the storage capacity, for example, may be to increase the number of channels 118. However, this may increase the size of controller 115, such as the silicon area, the number of pins, the number of printed circuit board routing layers, and the power requirements of the controller.

Figure 2A:
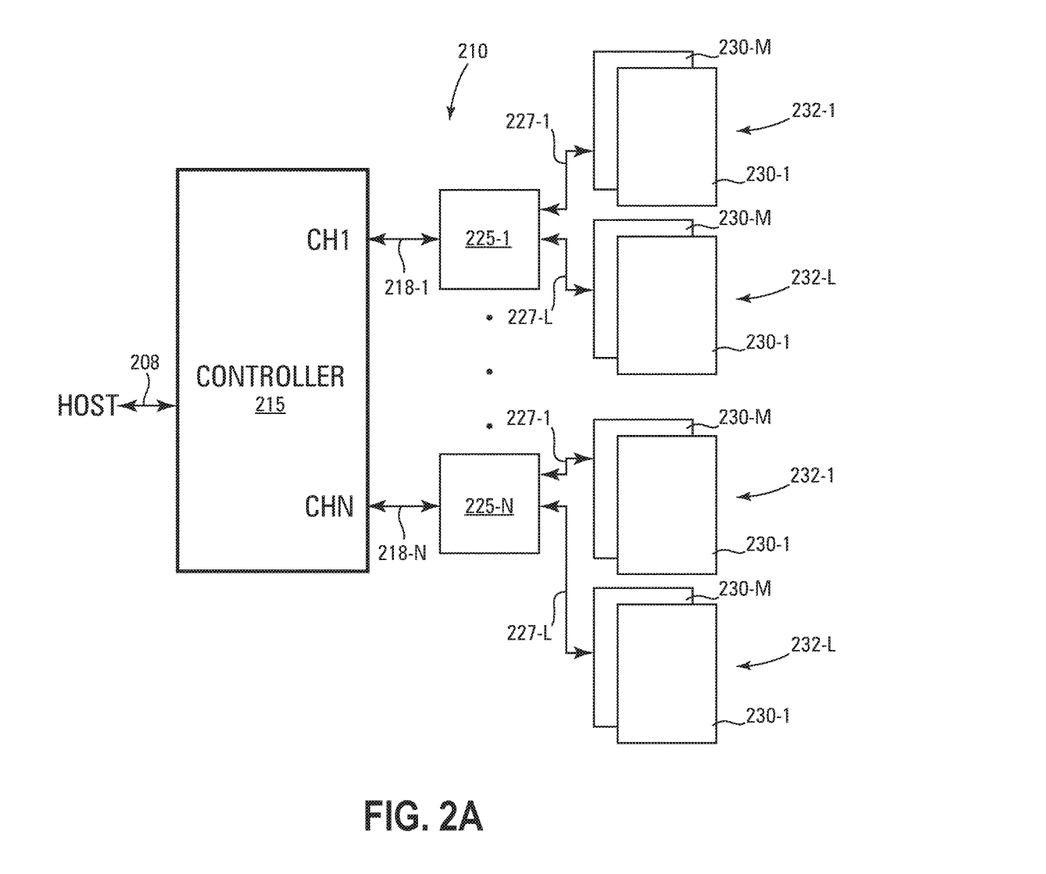
FIG. 2A is a block diagram that illustrates an example of an apparatus in accordance with a number of embodiments of the present disclosure.

FIG. 2A is a block diagram of an apparatus, such as a storage system 210 (e.g., a memory system, such as a solid drive), in accordance with a number of embodiments of the present disclosure. In some examples, storage system 210 may be coupled to a host by a link 208 to form a portion of a computing system.

Storage system 210 may include a controller 215 (e.g., memory control circuitry, firmware, and/or software), such as a memory system controller, that may be coupled to the host by the link 208. For example, controller 215 may receive commands, addresses, and data from the host and may transmit data and status signals to the host. Storage system 210 may be an enterprise storage system, for example, and controller 215 may be an enterprise controller, for example. In some examples, storage system 210 may be a cloud storage system, and controller 215 may be a cloud controller.

Memory system 210 may include a plurality of interface components 225 (e.g., application specific integrated circuits (ASICs)), such as interface components 225-1 to 225-N. Controller 215 may communicate with a respective interface component 225 over a respective channel 218. For example, controller 215 may control an interface component 225 over a channel 218. A respective channel 218 may convey addresses, commands, and data from controller 215 to a respective interface component 225 and data and status signals from the respective interface component 225 to controller 215. In some examples, controller 215 may act as a master controller and interface components 225 may act as slaves to controller 215.

In some examples, controller may respectively communicate with (e.g., control) respective ones of interface components 225-1 to 225-N respectively over respective ones of channels 218-1 (Ch1) to 218-N (ChN). For example, respective ones of channels 218-1 to 218-N may be respectively coupled between respective ones of interface components 225-1 to 225-N and controller 215.

A respective interface component 225 may communicate with (e.g., control) one or more memory devices, such as a group (e.g., a memory package 232) of memory devices 230-1 to 230-M over a channel 227. For example, each of interface components 225-1 to 225-N may communicate with respective ones of memory packages 232-1 to 232-L respectively over respective ones of channels 227-1 to 227-L. For example, respective ones of channels 227-1 to 227-L may be respectively coupled between respective ones of memory packages 232-1 to 232-L and an interface component 225. A respective channel 227, for example, may convey addresses, commands, and data from a respective interface component 225 to a respective package 232, and thus a respective memory device 230 of the respective package 232, and data and status signals from the respective interface package 232 to the respective interface component 225.

Each interface component 225, for example, may extend each channel 218 into L channels. Using multiple channels 227 per interface component 225 may act to increase the number of memory devices, and thus the storage capacity of storage system 210, (e.g., without increasing the number of channels per controller 215). For example, this may increase the storage capacity of storage system 210 compared to storage system 110 with little (e.g. or no) increase in the size of the controller 215, such as the silicon area, the number of pins of the controller 215, the number of printed circuit board routing layers of the controller 215, and/or the power requirements of the controller 215.

In some examples, an interface component 225 (e.g., each of interface components 225-1 to 225-N) may be controller (e.g., processor) based and may manage access operations, such as reads from and writes to the memory devices 230 coupled to that interface component 225. For example, an interface component 225 may receive packetized transmissions (e.g., packets) from controller 215, may depacketize the transmissions (e.g., deconstruct the packets), and may decide what memory device 230 to access and what access operations (e.g., reads or writes) to perform based on instructions (e.g., commands) contained in the deconstructed packets. In previous storage systems, such as storage system 110, for example, the controller 115 may manage access operations for each of the memory devices. In the example of FIG. 2A, some of the load on controller 215 may be transferred to the interface components 225 in accordance with a number of embodiments of the present disclosure.

For example, an interface component 225 may decide which memory device of the memory devices 230-1 to 230-M in which package of the packages 232-1 to 232-L with which to communicate (e.g., which memory device to access) in response to commands from controller 215. For example, an interface component 225 may receive from controller 215 a write command, an address (e.g., a logical address), and data to write to a location corresponding to the logical address and may decide which memory device to write the data to. For example, the interface component 225 may manage (e.g., control) the write operation for that memory device. An interface component 225 may receive from controller 215 a read command and an address and may decide which memory device to read the data from. For example, the interface component 225 may manage the read operation for that memory device.

Figure 2B:
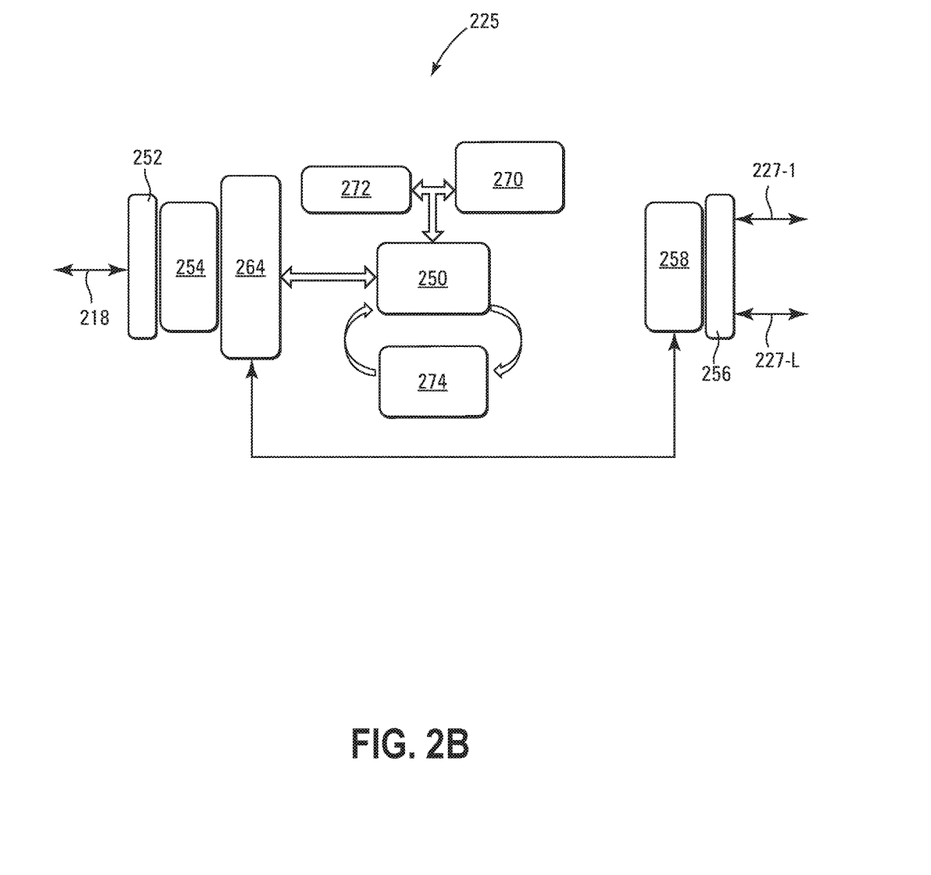
FIG. 2B is a block diagram that illustrates an example of an interface component in accordance with a number of embodiments of the present disclosure.

FIG. 2B is block diagram of an example of an interface component 225, such as any one of interface components 225-1 to 225-N in accordance with a number of embodiments of the present disclosure. For example, interface component 225 may include a controller (e.g., a main, such as a central, controller) 250 that may control operations of interface component 225. Controller 250 may include a processor, for example. Interface component 225 may control operation of each of the memory devices 230-1 to 230-M of each of the packages 232-1 to 232-L coupled to interface component 225. Each of the channels 227-1 to 227-L of interface component 225 may, for example, be addressed (e.g., and controlled) independently.

In some examples, interface component 225 may include a (e.g., high-speed) interface 252, such as a serial interface, that may be coupled to a channel 218 and that may communicate with controller 215 over the channel 218. For example, interface 252 may be a serializer/deserializer (SerDes) interface, a low-voltage differential signaling (LVDS) interface, a serialized Open NAND Flash Interface Working Group (ONFI) interface, such as a SerDes ONFI interface, etc. Interface 252 may, for example, communicate with controller 215 over a channel 218 using a serial format (e.g., serial transmissions). For example, interface 252 may receive serial transmissions as inputs from controller 215 and may output serial transmissions to controller 215. For example, a serial transmission may include a series of packets that may for example include commands (e.g., read and write), addresses, and data. In some examples, interface 252 may deserialize a serial input (e.g., containing a series of packets) from controller 215 and serialize parallel signals (e.g., packets) for output to controller 215.

Interface component 225 may include an interface controller 254, corresponding to interface 252, to control the flow of signals, such as the flow of addresses, commands, and data, across interface 252 to conform to certain standard, such as a high-speed serial standard, a SerDes standard, a SerDes ONFI standard, LVDS standard, etc.

In some examples, interface component 225 may include an interface 256 that may communicate with memory packages 232-1 to 232-L respectively over channels 227-1 to 227-L. For example, interface 256 may be an (e.g., a standard) ONFI interface, a serialized ONFI interface, an LVDS interface, etc. In some examples, interface 256 may be a parallel interface, such as a standard ONFI interface, and may communicate over each of channels 227-1 to 227-L using a parallel format (e.g., parallel transmissions). In other examples, interface 256 may be a serial interface and may communicate over each of channels 227-1 to 227-L using a serial format. In some examples, interface 256 may deserialize a serial input from a channel 227 (e.g., to parallel inputs, such as signals) and serialize parallel signals for output to a channel 227.

Interface component 225 may include an interface controller 258, corresponding to interface 256, to control the flow transmissions, such as the flow of addresses, commands, and data, across interface 256 so that it conforms to certain standard, such as an ONFI standard, a SerDes ONFI standard, an LVDS standard, etc.

In some examples, controller 250 may be coupled to and may control a packetizer/depacketizer 264. For example, controller 250 may cause packetizer/depacketizer 264 to depacketize packets from interface 252, and thus from controller 215. For example, packetizer/depacketizer 264 may depacketize packets from controller 215 that may include commands (e.g., read, write, or erase), addresses, such as in a memory device 230 of the memory devices 230-1 to 230-M coupled to a channel 227 (e.g., to be written to, read from, or erased), and data to written. Packetizer/depacketizer 264 may packetize data, for example, read from a memory device 230 for output to controller 215. In some examples, packetizer/depacketizer 264 may depacketize commands, addresses, and data for transmission over a channel 227 to a memory device 230 in a respective package 232.

In some examples, interface component 225 may include a memory-management unit (e.g., memory-management engine) 270 coupled to controller 250. For example, memory-management unit 270 may be used to control access to the memory devices 230 over a channel 227. In some examples, memory-management unit 270 may control access to a memory device 230 in response to a command, such as a command in a depacketized packet, (e.g., a read command or a write command) from controller 215.

Interface component 225 may include a wear-leveling engine 272 coupled to controller 250, for example. Controller 250 may use wear-leveling engine 272 to control wear-leveling operations performed on the memory devices 230 coupled to a channel 227 in response to instructions from controller 215, for example. Interface component 225 may indicate the completion of the wear-leveling to controller 215, for example.

Interface component 225 may include an error-correction engine 274, such as a low-density-parity-check engine, coupled to controller 250. For example, controller 250 may use error-correction engine 274 to correct data read from the memory devices 230 coupled to a channel 227 in response to instructions from controller 215, using error correction codes, such as low-density-parity-check correction codes. Interface component 225 may report the results of the error correction, such as whether the error correction was successful, to controller 215, for example.

In some examples, controller 250 may control garbage-collection operations performed on the memory devices 230 coupled to a channel 227 in response to instructions from controller 215, for example. Interface component 225 may indicate the completion of the garbage-collection operations to controller 215, for example.

In some examples, controller 250 may control overprovisioning operations performed on the memory devices 230 coupled to a channel 227 in response to instructions from controller 215, for example. For example, interface component 225 may inform controller 215 each time a read/write operation is performed on group of memory cells, such as a block of memory cells, of a memory device 230. When a certain number of write/erase operations is reached for a particular block of a memory device 230, controller 215 may instruct the interface component 225 to cause the memory device to replace the particular block with another block. Interface component 225 may indicate the completion of the replacement to controller 215, for example.

In previous storage systems, such as storage system 110, for example, the controller 115 may manage wear leveling, error correction, garbage collection, memory management, overprovisioning, etc. for each of the memory devices. This may use up bandwidth that may otherwise be used for reading and writing, for example. By allocating these operations to an interface component 225, bandwidth of controller 215 may be used for reading and writing instead of managing wear leveling, error correction, garbage collection, memory management, overprovisioning, etc. for each of the memory devices. This may result in reduced power consumption and improved performance (e.g., faster reads and writes in that controller 215 may not be occupied with applications that may allocated to interface components 225) compared to previous storage systems, such as storage system 110.

In some examples, (e.g., serialized) packets (e.g., a series of packets) may be received from controller 215 at interface 252 that may transmit the packets to packetizer/depacketizer 264. For example, interface 252 may deserialize the packets from a series of packets before transmitting them to packetizer/depacketizer 264. Packetizer/depacketizer 264 may then depacketize (e.g., deconstruct) the packets into commands and addresses, for example, to determine what operation to perform on which memory device 230 in which package 232 (e.g., coupled to which channel 227). For example, the address may include a certain location in a certain memory device 230 in a certain package 232.

The command may be a read command, for example. Interface component 225 (e.g., controller 250) may cause data to be read from the location having the address (e.g., address location) in response to the read command. For example, controller 250 may cause the read command and address to be sent to interface 256 and may cause interface 256 to transmit the read command and the address over a channel 227 (e.g., the respective one of channels 227-1 to 227-L coupled to the certain package 232) to the memory device 230 having the address location. The memory device 230 may read the data from the address location in response to the read command and address. The read data may be transmitted from the memory device 230 over the channel 227 to interface 256. For example, the read data may be received at interface 256 from the memory device 230.

In some examples, controller 250 may cause the read data to be sent to packetizer/depacketizer 264 that packetizes the read data. Controller 250 may cause the packetized read data to be sent to interface 252 that transmits the packetized read data to memory controller 215. For example, interface 252 may serialize the packetized read data (e.g., in series with other packetized read data) before transmitting the packetized read data to memory controller 215.

In some examples, the depacketized packets may include a write command and data to be written to the address location. Controller 250 may cause the data to be written to the address location in response to the write command. For example, controller 250 may cause the write command, the address, and the data to be sent to interface 256 and may cause interface 256 to transmit the write command, the address, and the data over the channel 227 to the memory device 230 having the address location. The memory device 230 may write the data to the address location in response to the write command and address.

Figure 3:
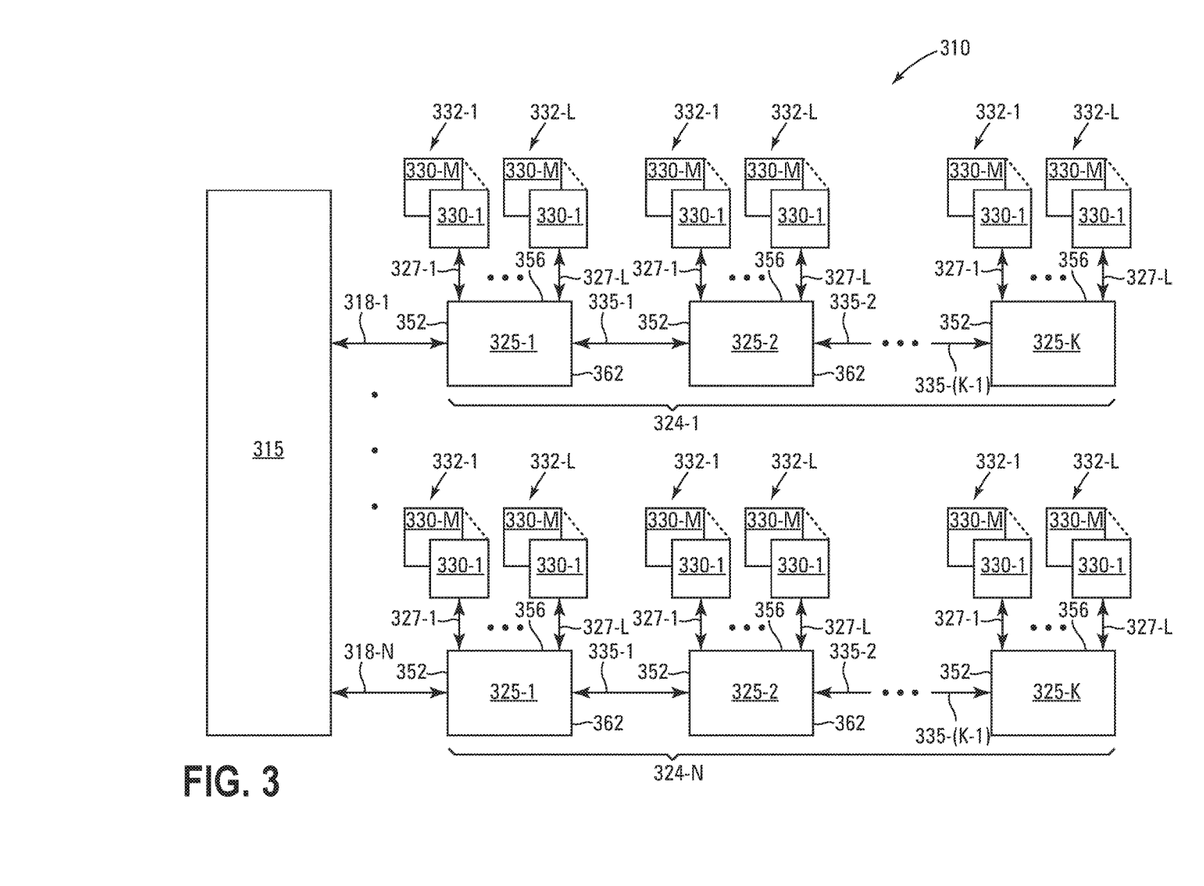
FIG. 3 is a block diagram that illustrates another example of an apparatus in accordance with a number of embodiments of the present disclosure.

FIG. 3 is a block diagram of an apparatus, such as a storage system 310 (e.g., a memory system, such as a solid-state drive), in accordance with a number of embodiments of the present disclosure. In some examples, storage system 310 may be coupled to a host to form a portion of a computing system.

Storage system 310 may include a controller 315 (e.g., memory control circuitry, firmware, and/or software), such as a memory system controller, that may be similar to (e.g., the same as) controller 215. Controller 315 may be coupled to the host, may receive commands, addresses, and data from the host, and may transmit data and status signals to the host.

Controller 315 may communicate with a respective group 324 (e.g., a respective one of groups 324-1 to 324-N), such as a sequence, of series-coupled interface components 325 (e.g. series-coupled interface components 325-1 to 325-K), such as ASICs, over a respective channel 318 (e.g., a respective one of channels 318-1 to 318-N). For example, controller 315 may communicate with respective ones of groups 324-1 to 324-N respectively over respective ones of channels 318-1 to 318-N. Respective ones of channels 318-1 to 318-N may be respectively coupled between respective ones of groups 324-1 to 324-N and controller 315, for example.

Each of channels 318 may convey signals between controller 315 and a respective group 324 of interface components 325, such as addresses from controller 315 to the respective group 324, commands from controller 315 to the respective group 324, status signals from the respective group 324 to controller 315, and data from controller 315 to the respective group 324 and/or to controller 315 from the respective group 324.

Each interface component 325 (e.g., each of interface components 325-1 to 325-K) in a group 324 (e.g., each of groups 324-1 to 324-N) may communicate over one or more channels, such as (e.g., parallel) channels 327-1 to 327-L. Each of channels 327-1 to 327-L may be coupled between a respective interface component 325 and a group (e.g., a memory package 332) of memory devices 330-1 to 330-M.

A channel 327, for example, may convey signals between an interface component 325 and a respective package 332, and thus each of the memory devices in the respective package, such as addresses from the interface component 325 to the respective package 332, commands from the interface component 325 to the respective package 332, status signals from the respective package 332 to interface component 325, and data from the interface component 325 to the respective package 332 and/or data from the respective package 332 to interface component 325.

The interface components 325 (e.g., interface components 325-1 to 325-K) in a group 324 of interface components, for example, may be interconnected in series by bi-directional links 335 (e.g., to form a sequence of interface components 325-1 to 325-K). For example, a bi-directional link 335, such as one of bi-directional links 335-1 to 335-(K−1), may couple two successive (e.g., immediately adjacent) interface components 325. For example, link 335-1 may couple successive interface components 325-1 and 325-2, in series.

In some examples, interface components 325-1 and 325-2 in a group 324 may determine whether to act on a (e.g., downstream) signal (e.g., a packet) from controller 315 or to pass the packet to the next (e.g., downstream) interface component in the group 324. Interface component 325-3 (e.g., the last interface component in the group 324 for K=3) may act on a packet received from an upstream interface component, such as interface component 325-2. For example, interface component 325-1 may pass the packet to interface component 325-2 (e.g., in response to a packet identifier not matching an identifier of interface component 325-1), and interface component 325-2 may pass the packet to (e.g., in response to the packet identifier not matching an identifier of interface component 325-2) to interface component 325-3.

In some examples, an interface component 325-1 may determine whether a packet from a respective channel 318 of controller 315 is intended for, and thus is to be acted on by, interface component 325-1. For example, if the packet is intended for interface component 325-1 (e.g., the packet identifier matches the identifier of interface component 325-1), interface component 325-1 may depacketize the packet and may decide for which memory device 330 of which memory package 332 the packet is intended. If interface component 325-1 determines from the depacketized packet that data is to read from a memory device coupled thereto, interface component 325-1 may cause the data to be read, may packetize the read data, and may send the read data (e.g., upstream) to controller 315.

If the packet is not intended for interface component 325-1 (e.g., the packet identifier does not match the identifier of interface component 325-1), interface component 325-1 may, for example, pass the packet (e.g., downstream (e.g., without first depacketizing)) to interface component 325-2 (e.g., the next interface component in the group of memory interface components 325-1 to 325-3 for K=3) that may determine whether the packet is intended for interface component 325-2. For example, if the packet is intended for interface component 325-2 (e.g., the packet identifier matches the identifier of interface component 325-2), interface component 325-2 may depacketize the packet and may decide for which memory device 330 of which memory package 332 the packet is intended. Otherwise, interface component 325-2 may pass the packet (e.g., downstream) to interface component 325-3 that may act on the packet. For example, when interface component 325-3 is the last interface component in the sequence, the packet received by interface component 325-3 may be acted on by default in that it was not intended for and acted on by the preceding interface components (e.g., interface components 325-1 and 325-2) in the sequence.

When interface component 325-2 determines from the depacketized packet that data is to read from a memory device coupled thereto, interface component 325-2 may cause the data to be read, may packetize the read data, and may send the packetized read data (e.g., upstream) to controller 315 through interface component 325-1. For example, interface component 325-1 may pass data (e.g., moving upstream) from interface component 325-2 (e.g., a downstream interface component in the sequence).

When interface component 325-3 receives a packet from interface component 325-2, interface component 325-3 may depacketize the packet. When interface component 325-3 determines from the depacketized packet that data is to read from a memory device coupled thereto, interface component 325-3 may cause the data to be read, may packetize the read data, and may send the packetized read data (e.g., upstream) to controller 315 through the interface components in the sequence between interface component 325-3 and controller 315, such as interface components 325-1 and 325-2. For example, interface components 325-1 and 325-2 may pass (e.g., upstream) data (e.g., from downstream interface components) moving toward controller 315.

In some examples, an interface component 325 (e.g., each of the interface components 325-1 to 325-K) may include a controller (e.g., a main controller), that, for example, may be similar to (e.g., the same as) the controller 250, for controlling operations of the interface component 325. An interface component 325 may include an interface 352, that, for example, may be similar to (e.g., the same as) the interface 252. For example, the interface 352 of interface component 325-1 may be coupled to a channel 318, the interface 352 of interface component 325-2 to link 335-1, and the interface 352 of interface component 325-K to link 335-(K−1). An interface component 325 may include an interface controller, that, for example, may be similar to (e.g., the same as) interface controller 254, corresponding to interface 352 to control the flow of transmissions, such as the flow of addresses, commands, and data, across interface 352.

In some examples, an interface component 325 may include an interface 356, that, for example, may be similar to (e.g., the same as) the interface 256. For example, interface 356 may be coupled to memory packages 332-1 to 332-L. An interface component 325 may include an interface controller, that, for example, may be similar to (e.g., the same as) interface controller 258, corresponding to interface 356 to control the flow of transmissions, such as the flow of addresses, commands, and data, across interface 356. In some examples, an interface component 325 may include a packetizer/depacketizer, that, for example, may be similar to (e.g., the same as) the packetizer/depacketizer 264, that may be coupled to the controller of the interface component 325.

In some examples, the interface components 325, such as interface components 325-1 and 325-2, between interface component 325-K and controller 315 may include an interface 362, that, for example, may be similar to (e.g., the same as) the interface 252. For example, interface 362 of interface component 325-1 may be coupled to interface 352 of interface component 325-2, and interface 362 of interface component 325-2 may be coupled to interface 352 of interface component 325-3 (e.g., for examples where K=3). The interface components 325 that may include an interface 362, may include an interface controller, that, for example, may be similar to (e.g., the same as) interface controller 254, corresponding to interface 362 to control the flow of transmissions, such as the flow of addresses, commands, and data, across interface 362.

In some examples, an interface component 325 may include a memory-management unit that, for example, may be similar to (e.g., the same as) the memory management unit 270, coupled to the controller of interface component 325, a wear-leveling engine that, for example, may be similar to (e.g., the same as) the wear-leveling engine 272, coupled to the controller of interface component 325, and an error correction engine that, for example, may be similar to (e.g., the same as) the error correction engine 274, coupled to the controller of interface component 325.

In some examples, the controller of an interface component 325 may control garbage-collection operations on the memory devices 330 coupled to a channel 327 in response to instructions from controller 315, for example. In some examples, the controller of an interface component 325 may control overprovisioning operations on the memory devices 330 coupled to a channel 327 in response to instructions from controller 315, for example, in a manner similar to (e.g., the same as) the overprovisioning discussed above in conjunction with FIG. 2B.

In some examples, a packet may be received at interface 352 of an interface component 325-1 in a group 324. The controller of interface component 325-1 may determine whether the packet is intended for interface component 325-1 (e.g., by determining whether an identifier of the packet matches an identifier of interface component 325-1). The controller may determine that the packet is intended for interface component 325-1 in response to the identifiers matching. When the packet is intended for interface component 325-1, the packetizer/depacketizer of interface component 325-1 may depacketize the packet into commands and addresses, for example, to determine what operation to perform on which memory device 330 in which package 332 coupled to interface component 325-1. In some examples, interface 352 of interface component 325-1 may deserialize the packet before depacketizing the packet in response to the controller of interface component 325-1 determining that the packet is intended for interface component 325-1.

When the command is a read command, for example, interface component 325-1 (e.g., the controller of interface component 325-1) may cause data to be read from a memory device 330 coupled to interface 356 of interface component 325-1 in response to the read command, such as in a manner similar to (e.g., the same as) that described above in conjunction with FIGS. 2A and 2B. The read data may be transmitted from the memory device 330 over a channel 327 to interface 356. In some examples, the controller may cause the read data to be sent to the packetizer/depacketizer that packetizes the read data. The controller may cause the packetized read data to be sent to interface 352 that transmits the packetized read data to controller 315. In some examples, interface 352 of interface component 325-1 may serialize the packetized read data before transmitting it to controller 315.

In some examples, the depacketized packets may include a write command and data to be written to a memory device 330 coupled to interface component 325-1. The controller of interface component 325-1 may cause the data to be written to the memory device 330 in response to the write command, such as in a similar manner to (e.g., the same manner as) that described above in conjunction with FIGS. 2A and 2B.

When the identifiers do not match at interface component 325-1, the packet may not be intended for interface component 325-1, and the packet may be sent (e.g., without deserializing or depacketizing) to interface 362 of interface component 325-1 and subsequently from interface 362 of interface component 325-1 to interface 352 of interface component 325-2 over link 335-1. The controller of interface component 325-2 may determine whether the packet is intended for interface component 325-2 (e.g., by determining whether the identifier of the packet matches an identifier of interface component 325-2). The controller may determine that the packet is intended for interface component 325-2 in response to the identifiers matching.

When the packet is intended for interface component 325-2, the packetizer/depacketizer of interface component 325-2 may depacketize the packet into commands and addresses, for example, to determine what operation to perform on which memory device 330 in which package 332 coupled to interface component 325-2. In some examples, interface 352 of interface component 325-2 may deserialize the packet before depacketizing the packet in response to the controller of interface component 325-2 determining that the packet is intended for interface component 325-2. Depending on whether the command is a read or a write command, the controller of interface component 325-2 may cause data to be read from or data in the packet to be written to a memory device 330 coupled to interface 356 of interface component 325-2, such as in a similar manner to (e.g., the same manner as) that described above for interface component 325-1.

Read data may be transmitted from the memory device 330 over a channel 327 to interface 356. In some examples, the controller of interface component 325-2 may cause the read data to be sent to the packetizer/depacketizer that packetizes the read data. The controller may cause the packetized read data to be sent to interface 352 of interface component 325-2 that transmits the packetized read data over link 335-1 to interface 362 of interface component 325-1 that may pass the packetized read data to interface 352 of interface component 325-1, where interface 352 of interface component 325-1 may send the packetized read data to controller 315 over a link 320. In some examples, the controllers of the interface components 325 between interface component 325-K and controller 315, such as interface components 325-1 and 325-2, of a group 324, may cause those interface components 325 to pass data (e.g., packets of read data) or signals that are moving upstream to controller 315. In some examples, interface 352 of interface component 325-2 may serialize the packetized read data before transmitting it to interface 362 of interface component 325-1.

A packet from controller 315 may move (e.g., downstream) from interface component 325 to interface component 325 in a group 324 until it arrives at the interface component 325 for which it is intended (e.g., until the identifier of the packet matches an identifier of an interface component 325). When it is determined that a packet is not intended for any of the interface components 325 between interface component 325-K and controller 315, the packet may (e.g., ultimately) arrive at interface component 325-K.

The packetizer/depacketizer of interface component 325-K may depacketize the packet into commands and addresses, for example, to determine what operation to perform on which memory device 330 in which package 332 coupled to interface component 325-K. In some examples, interface 352 of interface component 325-K may deserialize the packet before depacketizing the packet in response to the controller of interface component 325-K determining that the packet is intended for interface component 325-K. Depending on whether the command is a read or a write command, the controller of interface component 325-K may cause data to be read from or data in the packet to be written to a memory device 330 coupled to interface 356 of interface component 325-K, such as in a similar manner to (e.g., the same manner as) that described above for interface components 325-1 and 325-2.

Read data may be transmitted from the memory device 330 over a channel 327 to interface 356 of interface component 325-K. In some examples, the controller of interface component 325-K may cause the read data to be sent to the packetizer/depacketizer that packetizes the read data. The controller of interface component 325-K may cause the packetized read data to be sent to interface 352 of interface component 325-K that transmits the packetized read data to the interface 362 of the next upstream interface component, such as interface component 325-2 for K=3. Interface component 325-2 may pass the packetized read data to its interface 352 that may transmit the packetized read data to interface 362 of interface component 325-1 that may pass the packetized read data to its interface 352 that may transmit the packetized read data to controller 315. In some examples, interface 352 of interface component 325-3 may serialize the packetized read data before transmitting it to the interface 362 of the next upstream controller.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
   a controller configured to be coupled to a host;
   a first interface component coupled to the controller and to a first memory device; and
   a second interface component coupled to a second memory device and coupled in series with the first interface component;
   wherein the first interface component is configured to:
     receive a packet from the controller;
     determine whether the packet is intended for the first interface component; and
     send the packet to the second interface component in response to determining that the packet is not intended for the first interface component;
   wherein the second interface component is configured to:
     receive the packet sent thereto from the first interface component; and
     depacketize the packet.

2. The apparatus of claim 1, wherein the first and second interface components are application specific integrated circuits.

3. The apparatus of claim 1, wherein the first interface component is configured to serialize outputs to the controller and deserialize inputs from the controller.

4. The apparatus of claim 1, wherein the first interface component is configured to packetize an input from the first memory device and to send the packetized input to the controller.

5. The apparatus of claim 1, wherein the first interface component is configured to depacketize an input from the controller in response to determining that the packet is intended for the first interface component and to determine from the depacketized input an operation to be performed on the first memory device.

6. The apparatus of claim 1, wherein the first interface component comprises a packetizer/depacketizer and a controller configured to control the packetizer/depacketizer.

7. The apparatus of claim 1, wherein the first interface component comprises:
a first interface coupled to the controller and a second interface coupled to the the first memory device; and
an interface controller associated with the first interface.

8. An apparatus, comprising:
a first controller; and
a plurality of respective interface components, wherein
the respective interface components are coupled in parallel to the first controller through respective channels;
each respective interface component is coupled to a respective plurality of memory devices; and
each respective interface component comprises:
a second controller;
an interface configured to deserialize a series of packets received from the first controller; and
a packetizer/depacketizer configured to depacketize the packets of the deserialized series of packets.

9. The apparatus of claim 8, wherein each respective interface component further comprises at least one of a memory-management engine, a wear-leveling engine, and an error-correction engine coupled to the second controller.

10. The apparatus of claim 8, wherein each respective interface component further comprises:
an interface controller corresponding to the interface.

11. The apparatus of claim 8, wherein the second controller is to control at least one of error correction, access to a memory device of the respective plurality of memory devices, an overprovisioning operation on a memory device of the respective plurality of memory devices, and a garbage collection operation on a memory device of the respective plurality of memory devices.

12. The apparatus of claim 8, wherein the interface comprises an interface selected from the group comprising a serial interface, a SerDes interface, an LVDS interface, and a serialized ONFI interface.

13. A method of operating an apparatus, comprising:
receiving, from a controller, a packet at a first interface component that is coupled to a first memory device;
determining, by the first interface component, whether the packet is intended for the first interface component;
sending the packet to a second interface component, coupled to a second memory device and coupled in series with the first interface component, in response to determining that the packet is not intended for the first interface component; and
depacketizing the packet using the second interface component.

14. The method of claim 13, further comprising performing an operation on the second memory device in response to an instruction in the depacketized packet.

15. The method of claim 14, wherein performing the operation on the second memory device comprises reading data from a location in the second memory device specified in the depacketized packet.

16. The method of claim 15, further comprising packetizing the read data using the second interface component and sending the packetized read data to the controller through the first interface component from the second interface component.

17. The method of claim 16, further comprising using the second interface component to serialize the packetized read data before sending the packetized read data to the controller.

18. The method of claim 14, wherein performing the operation on the second memory device comprises writing data contained in the depacketized packet to a location in the second memory device specified in the depacketized packet.

19. The method of claim 13, further comprising using the second interface component to deserialize the packet before depacketizing the packet.

20. The method of claim 13, further comprising:
depacketizing the packet using the first interface component in response to determining that the packet is intended for the first interface component; and
performing an operation on the first memory device in response to an instruction in the depacketized packet depacketized by the first interface component.

* * * * *